United States Patent
Wu et al.

(10) Patent No.: US 7,149,931 B2
(45) Date of Patent: Dec. 12, 2006

(54) METHOD AND APPARATUS FOR PROVIDING FAULT TOLERANCE TO MEMORY

(75) Inventors: Chang-Lien Wu, Tai-Chung (TW); Chih-Ching Wang, Tai-Chung Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 394 days.

(21) Appl. No.: 10/708,347

(22) Filed: Feb. 25, 2004

(65) Prior Publication Data

US 2005/0193234 A1    Sep. 1, 2005

(51) Int. Cl.
    *G06F 11/00* (2006.01)
(52) U.S. Cl. ........................................... 714/42
(58) Field of Classification Search .................. 714/30, 714/42
    See application file for complete search history.

(56) References Cited

U.S. PATENT DOCUMENTS

| | | | |
|---|---|---|---|
| 5,051,997 A | 9/1991 | Sakashita et al. | |
| 6,550,023 B1 | 4/2003 | Brauch et al. | |
| 6,615,378 B1 * | 9/2003 | Dwork | 714/733 |
| 6,781,898 B1 | 8/2004 | Kim et al. | |
| 6,857,092 B1 | 2/2005 | Fox | |
| 6,917,548 B1 | 7/2005 | Kim et al. | |
| 6,952,623 B1 | 10/2005 | McAdams et al. | |
| 2003/0145250 A1 * | 7/2003 | Chin | 714/30 |
| 2004/0028048 A1 * | 2/2004 | Jin | 370/392 |
| 2004/0085821 A1 * | 5/2004 | Kim et al. | 365/200 |
| 2005/0188286 A1 | 8/2005 | Liu et al. | |

FOREIGN PATENT DOCUMENTS

TW    567414    12/2003

OTHER PUBLICATIONS

Raj Jain; A Comparison of Hashing Schemes for Address Lookup In Computer Networks; p. 1-p. 5.
Chih-Tsun Huang, Jing-Reng Huang, Chi-Feng Wu, Cheng-Wen Wu, Tsin-Yuan Chang (National Tsing Hua University); A Programmable BIST Core for Embedded DRAM; Jan.-Mar. 1999; p. 59-p. 69.

* cited by examiner

*Primary Examiner*—Michael Maskulinski
(74) *Attorney, Agent, or Firm*—Winston Hsu

(57) ABSTRACT

A method and networking apparatus for providing fault tolerance to memory are disclosed. The networking apparatus contains a first memory for storing host/port relationships, a second memory for indicating the status of the first memory, and a processor coupled to the memories for manipulating the memories. Furthermore, the claimed invention may also include an optional third memory for serving as a secondary site for storing information regarding host/port relationships.

22 Claims, 6 Drawing Sheets

METHOD AND APPARATUS FOR PROVIDING FAULT TOLERANCE TO MEMORY

BACKGROUND OF INVENTION

1. Field of the Invention

The invention relates to a method and apparatus for providing fault tolerance to a memory and more particularly, to a method and a networking apparatus, such as a switch, a router, or the like, for providing fault tolerance to a memory.

2. Description of the Prior Art

A networking apparatus such as a switch, a router, or the like, is usually employed in the construction of a network of computers. One of the functions of the networking apparatus is to efficiently forward data sent by users (computers on the network) to the data's destination via the ports of the networking apparatus. To accomplish this task, information about host/port relationships must be stored in the memory of the networking apparatus, which is often in the form of a look-up table called a MAC address table.

The MAC address table records the source MAC IDs (SIDs) of incoming packets. If there is an incoming packet to be stored in the MAC memory, a rule called "hashing" is defined for mapping the incoming packet to a specific look-up table entry based on the MAC ID of the incoming packet. Whenever a packet enters the networking apparatus, the networking apparatus picks the destination MAC ID (DID) of this incoming packet and uses the DID to perform hashing. Hashing of the DID maps this DID to a specific entry in the look-up table. The networking apparatus checks the MAC ID stored in this entry to see whether this MAC ID appeared before and has been recorded in the table, this step being called "search". If the MAC ID stored in this entry is invalid, out of date, or valid but different from the DID under searching, the search result is "missed". However, if the MAC ID stored in this entry is valid and indeed equal to the DID of the incoming packet, the search result is "hit". The networking apparatus decides how to forward the packet based on the search result is "missed", and this packet is a legal packet, this incoming packet will be broadcasted to all the ports except the inbound port. If the search result is "hit", this incoming packet will be forwarded to the associated port. This step is called "forward". After forwarding, the network apparatus would try to "learn" the "SID-inbound port" relationship and record the relationship into the look-up table.

One of the aims of utilizing the look-up table in the MAC memory is to prevent unnecessary broadcasting of the incoming packets so that the amount of data transmission can be reduced. Because of the important role the MAC memory storing the host/port relationship plays, current networking apparatus employ only memory free of defects.

However, the fabrication process of memory is by no means perfect. In other words, the yield of memory with no physical defects from the manufacturing process of memory is not 100%. For every batch of memory fabricated, a substantial portion will prove to be defective and as a result be discarded. The end result is a higher manufacturing cost.

As for details concerning hashing schemes, please refer to "a comparison of hashing schemes for address lookup in computer networks", by Jain, IEEE Transactions on Communications, COM40 (10): 1570–1573, October 1992, which is incorporated herein for reference.

SUMMARY OF INVENTION

Therefore, one of the many objectives of the claimed invention is to provide a method and apparatus for providing fault tolerance to a memory.

According to the claimed invention, a networking apparatus is disclosed. The networking apparatus for providing fault tolerance to memory comprises a first memory for storing information regarding host/port relationships; and a second memory for indicating the status of the first memory; wherein the networking apparatus marks the second memory based upon the status of the first memory.

According to the claimed invention, a method for providing fault tolerance to memory in a networking apparatus is also disclosed. The method comprises performing a built-in self test (BIST) on a first memory when the networking apparatus powers on; marking a second memory to indicate which sections of the first memory are defective; locating one of the sections of the first memory according to the packet; and checking the portion of the second memory corresponding to the located section of the first memory to determine how to handle the packet.

One of the many advantages of the claimed invention is the ability of the claimed invention to use defective memory. This ability allows manufacturers to manufacture more networking apparatuses for every batch of memory fabricated. Because of the resulting efficiency, production costs can be lowered.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
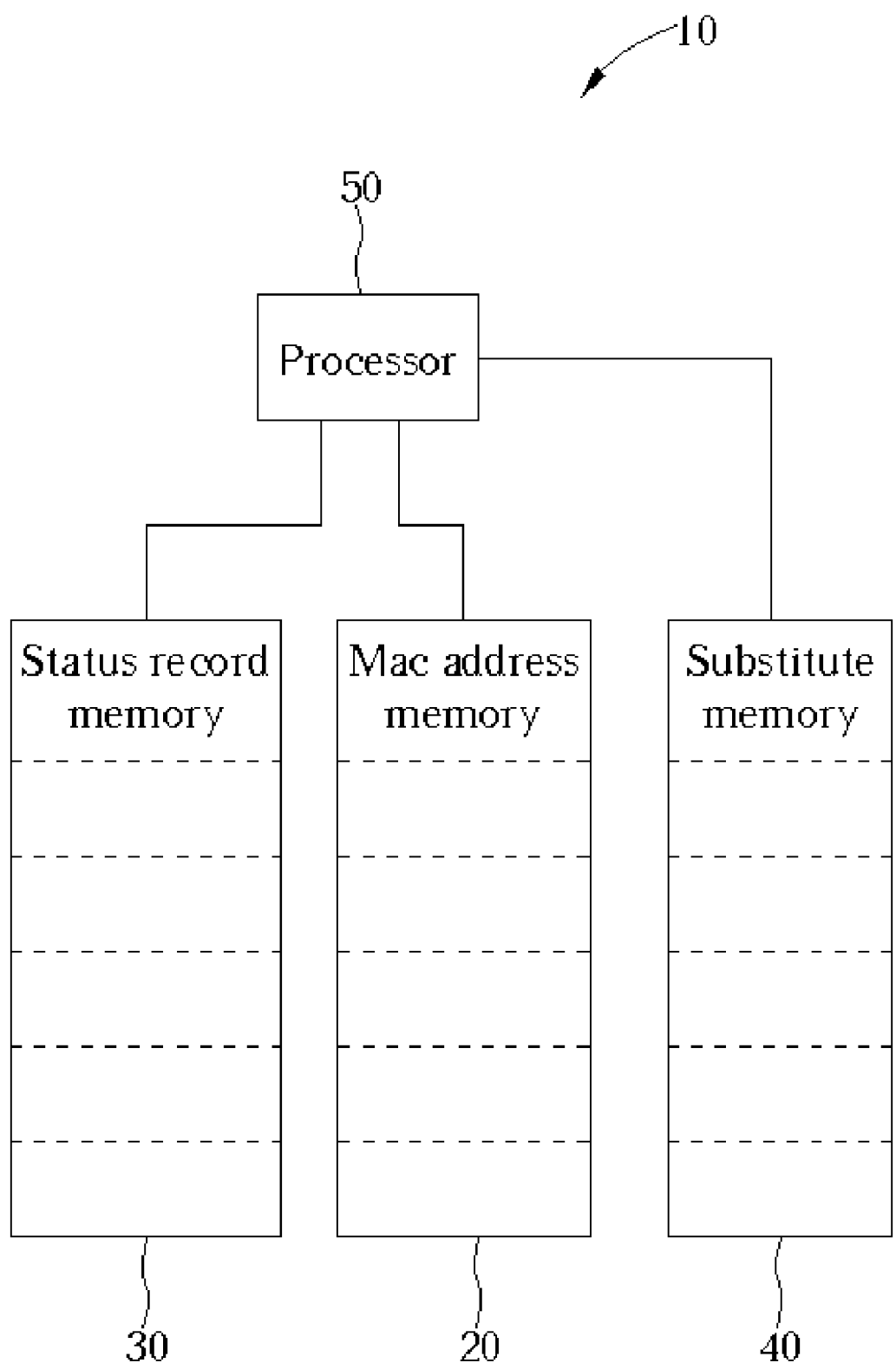
FIG. 1 is a diagram of a networking apparatus according to one embodiment of the present invention.

Please refer to FIG. 1. FIG. 1 is a simplified diagram of a networking apparatus 10 according to an embodiment of the present invention. In this preferred embodiment, the networking apparatus 10 comprises a MAC address memory 20, a status record memory 30, a substitute memory 40, and a processor 50 coupled to the memories 20, 30, 40. The MAC address memory 20 is for storing host/port (SID-inbound port) relationships as used in a conventional networking apparatus, the status record memory 30 is for indicating the status of the MAC address memory 20, the substitute memory 40 is for serving as a secondary site for storing information regarding host/port relationships, and the processor 50 is for manipulating the memories 20, 30, 40.

The networking apparatus 10 can be embodied by a switch, a router, or the like. In this embodiment, a switch is taken as an example for the network apparatus 10. The MAC address memory can be embodied by but not limited to SRAM memory. The status record memory 30 can be embodied by but not limited to a group of registers. In this embodiment, each register corresponds to one of the entries of the MAC address memory 20. However, it is not the limitation of the present invention. The substitute memory 40 can be embodied by but not limited to a CAM content addressable memory. The embodiments of these parts are merely to serve as examples and are not meant to act as limitations. The specification will refer to the parts of the invention by their given examples.

Please note that the substitute memory 40 in this embodiment is an optional part. The following descriptions will detail how to enable the invention with or without the substitute memory 40.

Figure 2:
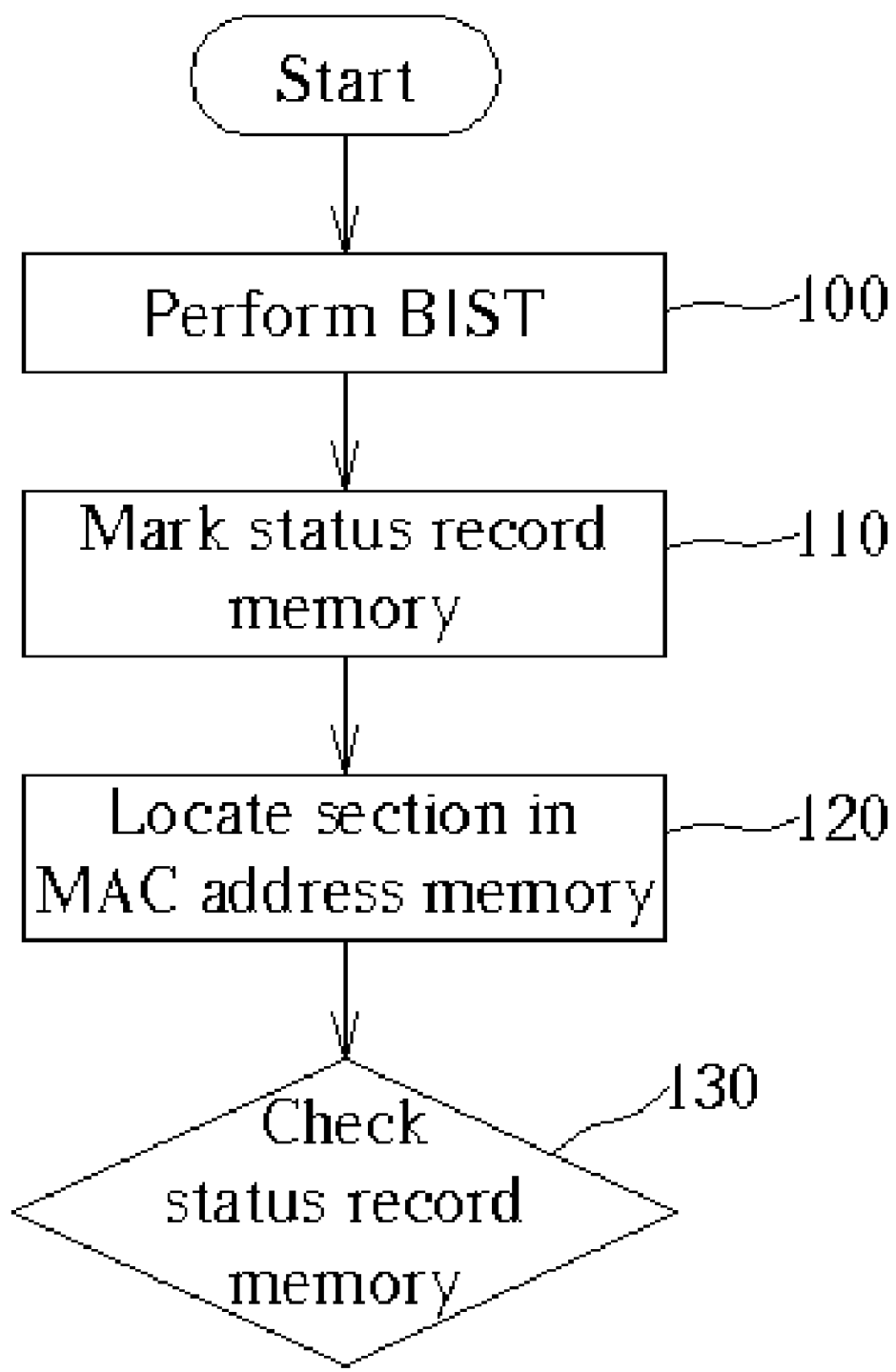
FIG. 2 is a flowchart of a process employed by a networking apparatus when handling a packet according to one embodiment of the present invention.

Please refer to FIG. 2. FIG. 2 is a flowchart of a base process employed by the networking apparatus 10 when handling a packet according to an embodiment of the present invention. The flowchart shown in FIG. 2 at least includes the following steps:

Step 100: Perform a BIST Built In Self-Test. A switch 10 performs a BIST to check if there is any defect present in a SRAM 20 when the switch is first powered on.

Step 110: Mark Status Record Memory. If any defects are found in the SRAM 20, the switch 10 will mark a corresponding register 30 accordingly for each found defect. The corresponding defects are marked so that the switch 10 will be able to determine if a located entry in the SRAM 20 is suitable for storing information. It should be noted that the marking of the register 30 is not to be limited in a corresponding manner. The mark stored in the registers 30 can be in the form that the specific entry with defect can be identified. Thus, the size and the number of the registers 30 can be reduced.

Step 120: Locate Entry in MAC Address Memory. Whenever a packet is being handled, the switch 10 performs searching to the packet and locates an entry in the SRAM 20 according to the MAC ID of the incoming packet. In this embodiment, the entry is located based on either the Destination ID or the Source ID of the packet, depending on if the switch is conducting packet transmission or packet information learning. The located entry in the SRAM 20 should indicate which port that the packet should be forwarded to or serve as the entry the packet information should be learned into.

Step 130: Check Status Record Memory. However, since the located entry in the SRAM 20 may be detective and therefore does not indicate which port that the packet should be forwarded to or cannot serve as the entry the packet information should be learned into, the register 30 is checked. In this embodiment, the switch 10 checks to see how the register 30 corresponding to the located entry is marked. If the marking of the register 30 is not in a corresponding manner, the switch 10 will check if there is at least one of the markings stored in the register 30 identify the specific entry.

For details concerning BIST, please refer to "a programmable BIST core for embedded DRAM", by Huang et. al., IEEE Design and Test Magazine, January–March 1999, which is incorporated herein for reference.

Figure 3:
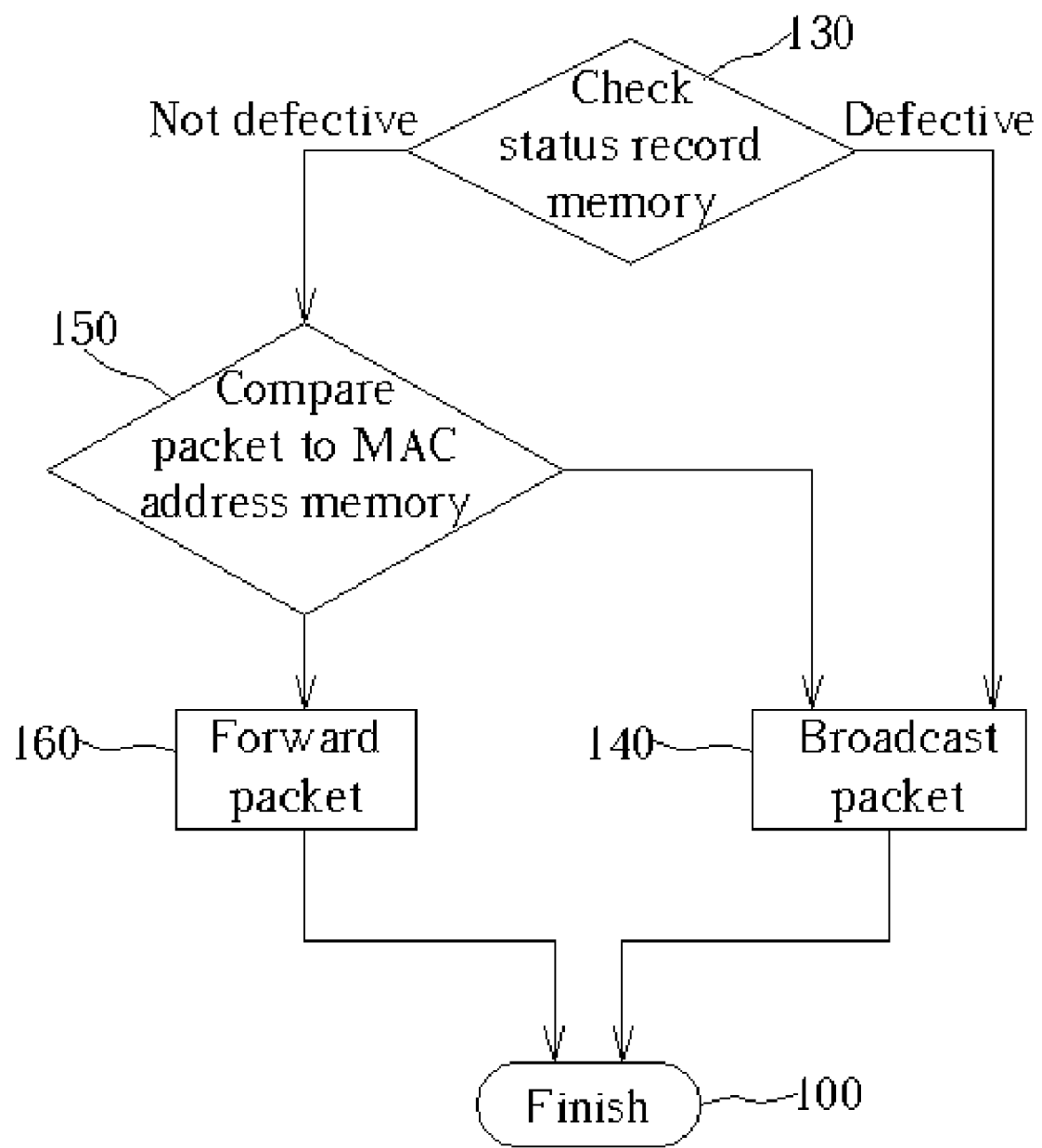
FIG. 3 is a flowchart of a packet transmission process in a networking apparatus when there is no substitute memory present according to one embodiment of the present invention.

FIG. 3–FIG. 6 are a continuation from the process in FIG. 2. The steps that follow Step 130 in FIG. 2 depend on what process the switch 10 executes. Please refer to FIG. 3. FIG. 3 is a flowchart of a packet transmission process in a networking apparatus 10 when there is no substitute memory 40 present according to an embodiment of the present invention.

Step 130: Check Status Record Memory. However, since the located entry in the SRAM 20 may be defective and therefore does not indicate which port that the packet should be forwarded to or cannot serve as the entry the packet information should be learned into, the register 30 is checked. In this embodiment, the switch 10 checks to see how the register 30 corresponding to the located entry is marked. If the marking of the register 30 is not in a corresponding manner, the switch 10 will check if there is at least one of the markings stored in the register 30 identify the specific entry.

Step 140: Broadcast Packet. Because the register 30 indicates that the located entry is defective or that the content of the located entry does not match, the switch 10 will be unable to find the port that the packet should be forwarded to. Therefore, the switch 10 broadcasts the packet to all ports except for the port that the packet originated from. Go to Step 170.

Step 150: Compare Packet to MAC Address Memory. Even though the register 30 indicates that the located entry is not defective, the switch 10 needs to check the content of the located entry of the SRAM 20 by comparing it to the MAC ID of the packet. If the content of the packet and the located entry match, go to Step 160. Otherwise, go to Step 140.

Step 160: Forward Packet. The content of the located entry of the SRAM 20 matches, and the switch 10 is able to forward the packet to the port in accordance with the content of the located entry of the SRAM 20.

Step 170: Finish. The handling of the packet is finished, and the switch returns to Step 120 in FIG. 2 to await the handling of the next packet.

Figure 4:
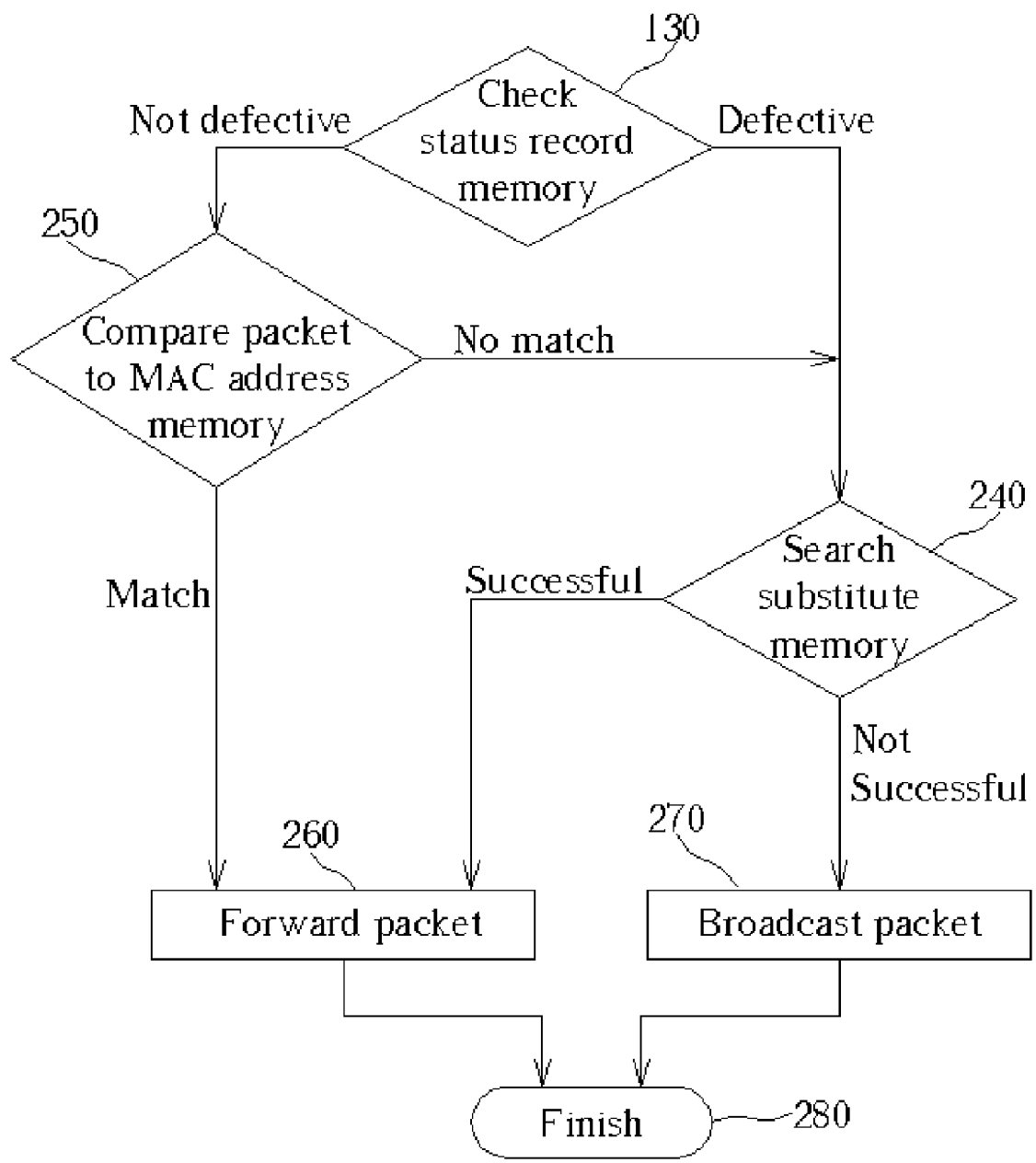
FIG. 4 is a flowchart of a packet transmission process in a networking apparatus when there is a substitute memory present according to one embodiment of the present invention.

Please refer to FIG. 4. FIG. 4 is a flowchart of a packet transmission process in a networking apparatus 10 when there is a substitute memory 40 present according to an embodiment of the present invention.

Step 130: Check Status Record Memory. However, since the located entry in the SRAM 20 may be detective and therefore, not indicate which port that the packet should be forwarded to, the status record memory is checked. If the register 30 indicates the located entry is defective, go to Step 240. Otherwise, go to Step 250.

Step 240: Search Substitute Memory. Because the register 30 indicates that the located entry is defective, the switch 10 will search the CAM 40 for the information indicating which port that the packet should be forwarded to. In this preferred embodiment, the switch 10 searches the CAM 40 according to the packet for a match with the packet. If the search is successful, go to Step 260. Otherwise, go to Step 270.

Step 250: Compare Packet to MAC address Memory. Even though the register 30 indicates that the located entry is not defective, the switch 10 needs to check the content of the located entry of the SRAM 20 by comparing it to the packet. If the content of the packet and the located entry match, go to Step 260. Otherwise, go to Step 240.

Step 260: Forward Packet. The switch 10 forwards the packet to the port in accordance with the content of the located entry of the SRAM 20 or the found entry in the CAM 40. Go to Step 280.

Step 270: Broadcast Packet. Because the content in the located entry of the SRAM 20 does not match or search in the CAM 40 is unsuccessful, the switch 10 will be unable to find the port that the packet should be forwarded to. Therefore, the switch 10 broadcasts the packet to all ports except for the port that the packet originated from.

Step 280: Finish. The handling of the packet is finished, and the switch returns to Step 120 in FIG. 2 to await the handling of the next packet.

FIG. 4 differs from FIG. 3 in what is done if the corresponding register 30 indicates that the located entry of the SRAM 20 is defective, as well as in what is done if the comparison between the packet and the located entry does not have a match. Instead of directly broadcasting the packet as in FIG. 3, FIG. 4 has the CAM 40 searched according to the content of the incoming packet. It should be noted that the function of the substitute memory 40 is to provide an additional and substitution space for the MAC address memory 10. If the entry of the MAC address memory 10 is defective, the content of the incoming packet, which ought to be stored in the defective entry can be stored in the substitute memory 40. In this embodiment, the substitute memory 40 is a content addressable memory, CAM. That is, the content of the incoming packet can be stored in the CAM directly if the corresponding entry of the MAC address memory is defective.

Figure 5:
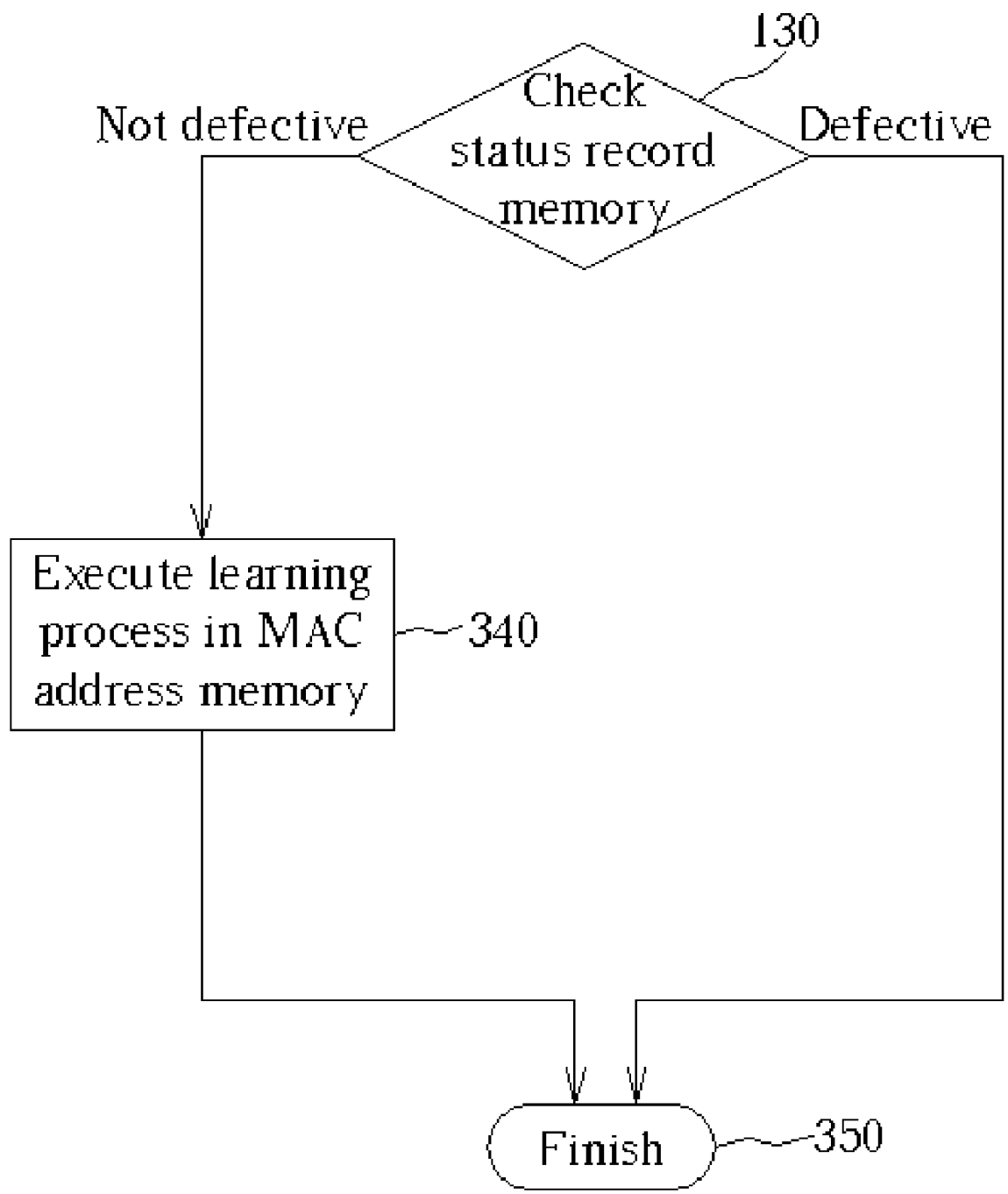
FIG. 5 is a flowchart of a packet information learning process in a networking apparatus when there is no substitute memory present according to one embodiment of the present invention.

FIG. 5 is a flowchart of a packet information learning process in a networking apparatus 10 when there is no substitute memory present according to one embodiment of the present invention.

Step 130: Check Status Record Memory. However, since the located entry in the SRAM 20 may be detective and therefore does not indicate which port that the packet should be forwarded to, the status record memory is checked. If the register 30 indicates the located entry is not defective, go to Step 340. Otherwise, go to Step 350.

Step 340: Execute Learning Process In MAC address Memory. Since the register 30 indicates that the located entry in the SRAM 20 is not defective, the switch 10 is able to store information into the located entry. Therefore, the switch 10 executes the learning process in the SRAM 20. The learning process comprises checking the content of the located entry in the SRAM 20, and if the located entry in the SRAM 20 is available, learning the information pertaining to the packet. For example, in this preferred embodiment, the switch 10 checks an ID stored inside the located entry. The switch 10 will learn the SID of the packet in all cases except when the located entry stores an ID, which is valid but different from the Source ID of the packet.

Step 350: Finish. The handling of the packet is finished, and the switch returns to Step 120 in FIG. 2 to await the handling of the next packet.

Figure 6:
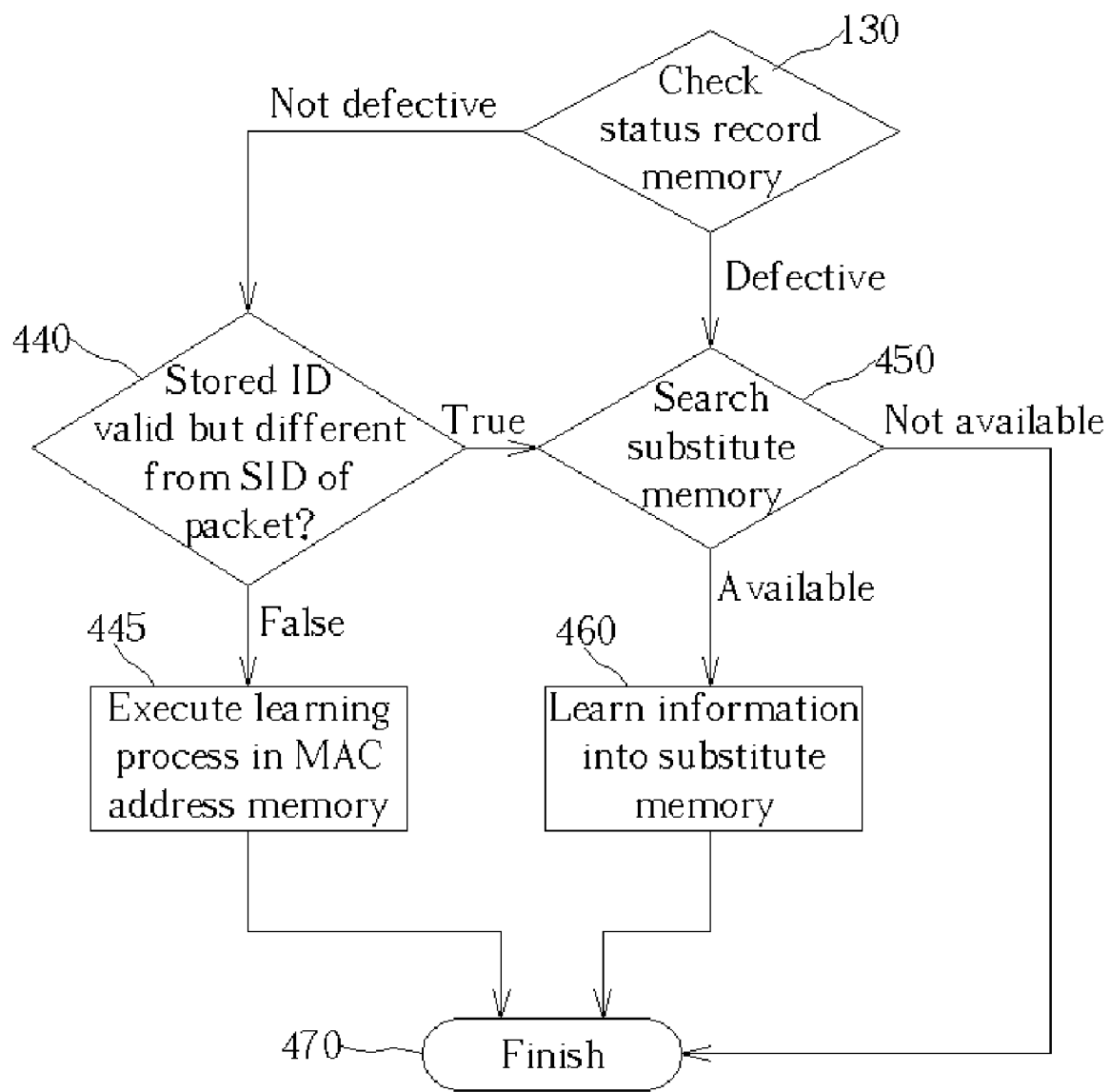
FIG. 6 is a flowchart of a packet information learning process in a networking apparatus when there is a substitute memory present according to one embodiment of the present invention.

FIG. 6 is a flowchart of a packet information learning process in a networking apparatus 10 when there is a substitute memory present according to an embodiment of the present invention.

Step 130: Check Status Record Memory. However, since the located entry in the SRAM 20 may be detective and therefore does not indicate which port that the packet should be forwarded to, the status record memory is checked. If the register 30 indicates the located entry is not defective, go to Step 440. Otherwise, go to Step 450.

Step 440: Check Located Entry. Since the register 30 indicates that the located entry in the SRAM 20 is not defective, the switch 10 is able to store information into the located entry. Therefore, the switch 10 will execute the learning process. However, before the learning process, the switch 10 first checks the content stored in the located entry for validity and value. If the stored ID is valid but different from the SID of the packet, go to Step 450; otherwise, go to Step 445.

Step 445: Execute Learning Process In MAC Address Memory. In this embodiment, when the located entry in the SRAM 20 is available, the switch 10 will learn the SID of the packet in all cases except when the located entry stores an ID, which is valid but different from the Source ID of the packet. Go to Step 470.

Step 450: Search Substitute Memory. Following Step 130 or Step 440, the switch 10 will attempt to learn information pertaining to the packet into the CAM 40. In the preferred embodiment, the switch 10 searches the CAM 40 according to the packet. If the located entry of the CAM 40 is available, go to Step 460. Otherwise, go to Step 470.

Step 460: Learn Information Into Substitute Memory. The switch 10 learns information pertaining to the packet into the located entry of the CAM 40. The information learned is the same as in Step 440.

Step 470: Finish. The handling of the packet is finished, and the switch returns to Step 120 in FIG. 2 to await the handling of the next packet.

FIG. 6 differs from FIG. 5 in what is done if the corresponding register 30 indicates that the located entry of the SRAM 20 is defective as well as in what is done if the stored ID is found to be valid but different from the SID of the packet. Instead of going directly to the finishing step as in FIG. 5, the switch 10 searches the CAM 40 according to the content of the packet.

In other words, FIG. 2 to FIG. 6 illustrate how a packet is handled. To be specific, FIG. 2 and FIG. 3 detail packet transmission using only a SRAM 20 and set of registers 30. FIG. 2 and FIG. 4 also detail packet transmission but with the addition of a CAM 40. FIG. 2 and FIG. 5 detail packet information learning process using only a SRAM 20 and a set of registers 30. FIG. 2 and FIG. 6 detail packet information learning process but with the addition of a CAM 40.

Please note that the reception of a packet can cause the switch 10 to conduct two processes. For example, upon receiving a packet, the switch 10 can execute the packet transmission and then return to the locating step in FIG. 2 and execute packet information learning before returning to a finishing step. Also, the order of the two processes can be reversed with packet information learning occurring before packet transmission.

As one can see, the embodiments of the present invention allow manufacturers to incorporate defective memory into the networking apparatus. Using the information disclosed, the networking apparatus with defective memory is able to function in substantially the same way to achieve substantially the same result as a networking apparatus with defective-free memory.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A networking apparatus for providing fault tolerance to memory comprising:

a first memory including a plurality of entries to store data concerning a packet with address information, wherein the data concerning the packet is stored in one of the entries according to the address information, and the first memory is a MAC address memory; and a second memory to store a status of at least one of the entries, wherein the status indicates whether or not the corresponding entry is defective.

2. The networking apparatus in claim 1, wherein the data concerning the packet includes a host/port relationship.

3. The networking apparatus in claim 1, wherein the address information includes a MAC ID of the packet.

4. The networking apparatus in claim 3, wherein the address information includes a source ID (SID) of the packet.

5. The networking apparatus in claim 3, wherein the address information includes a destination ID (DID) of the packet.

6. The networking apparatus in claim 3, wherein the relationship between the address information of the packet and the corresponding entry of the first memory is determined by a hashing scheme.

7. The networking apparatus in claim 1, wherein the second memory as at least a register.

8. The networking apparatus in claim 1, wherein the networking apparatus further includes a third memory to store the data concerning the packet if the entry corresponding to the packet is defective.

9. The networking apparatus in claim 8, wherein the third memory is a content-addressable memory (CAM).

10. The networking apparatus in claim 1 wherein the networking apparatus is a switch.

11. The networking apparatus in claim 1 wherein the networking apparatus is a router.

12. A method for providing fault tolerance to memory in a networking apparatus comprising:

performing a built-in self test (BIST) on a first memory including a plurality of entries;

marking a second memory to indicate a status of at least one of the entries, wherein the status is for indicating whether the corresponding entry is defective;

finding an entry of the first memory according to address information of a packet;

checking the second memory to determine whether the entry corresponding to the address information of the packet is defective or not; and storing data concerning the packet in a third memory if the first memory is defective.

13. The method in claim 12, further comprising:

broadcasting the packet if the entry corresponding to the address information of the packet is defective.

14. The method in claim 12, wherein the address information includes a MAC ID of the packet.

15. The method in claim 14, wherein the address information includes a source ID (SID) of the packet.

16. The method in claim 14, wherein the address information includes a destination ID (DID) of the packet.

17. The method in claim 12, wherein the relationship between the address information of the packet and the corresponding entry of the first memory is determined by a hashing scheme.

18. The method in claim 12, further comprising:

comparing the address information of the packet with a content of the corresponding entry of the first memory if the corresponding entry of the first memory is not defective;

forwarding the packet to a specific port according to the content of the corresponding entry of the first memory if the comparison yields a match; and broadcasting the packet if the comparison does not yield a match.

19. The method in claim 18 further comprising:

storing data concerning the packet into the corresponding entry of the first memory if the comparison does not yield a match.

20. The method in claim 12 further comprising:

comparing the data of the packet with a content of the corresponding entry of the first memory if the corresponding entry of the first memory is not defective;

comparing the data of the packet with a content of the third memory if the corresponding entry of the first memory is defective; and forwarding the packet to a specific port according to at least one of the content of the corresponding entry of the first memory and the third memory if the comparison yields a match.

21. The method in claim 20 further comprising:

storing the data of the packet into the third memory if the comparison does not yield a match.

22. A networking apparatus for providing fault tolerance to memory comprising:

a first memory including a plurality of entries to store data concerning a packet with address information, wherein the data concerning the packet is stored in one of the entries according to the address information;

a second memory to store a status of at least one of the entries, wherein the status indicates whether or not the corresponding entry is defective; and a third memory to store the data concerning the packet if the entry corresponding to the packet is defective.

* * * * *